United States Patent [19]

Labranche et al.

[11] Patent Number: 5,825,803
[45] Date of Patent: Oct. 20, 1998

[54] MULTIPLE EMITTER LASER DIODE ASSEMBLY WITH GRADED-INDEX FIBER MICROLENS

[75] Inventors: Bruno Labranche, Sainte-Foy; Kevin Snell, St-Rédempteur; André Parent, des Érables, all of Canada

[73] Assignee: Institut National d'Optique, Sainte-Foy, Canada

[21] Appl. No.: 572,089

[22] Filed: Dec. 14, 1995

[51] Int. Cl.$^6$ .................................................. H01S 3/08
[52] U.S. Cl. ........................ 372/101; 372/108; 372/75; 372/98
[58] Field of Search ............................... 372/101, 108, 372/75, 92, 71, 61, 69, 68

[56] References Cited

U.S. PATENT DOCUMENTS

| 3,823,995 | 7/1974 | Carpenter | 350/96 |
| 4,009,394 | 2/1977 | Mierzwinski | 250/552 |
| 4,203,743 | 5/1980 | Suganuma et al. | 65/3 |

(List continued on next page.)

OTHER PUBLICATIONS

Di Francia, et al., "Perfect Concentric Systems with an Outer Shell of Constant Refractive Index", *Ottica Geometrica*, 1958, pp. 223–235.

Di Francia, "Spherical Lenses for Infrared and Microwaves", *Journal of Applied Physics*, 32 (1961) p. 2051.

Doric, "Generalized nonfull–aperture Luneburg lens: a new solution", *Optical Engineering*, vol. 32, No. 9, Sep. 1993, Bellingham, WA, pp. 2118–2121.

Kikuchi, et al., "Cladded radially inhomogeneous sphere lenses", *Applied Optics*, vol. 20, No. 3, Feb. 1981, pp. 388–394.

Kikuchi, et al., "Graded–index sphere lens with hemispherical rod cladding", *Applied Optics*, vol. 21, No. 15, Aug. 1982, pp. 2734–2738.

Morgan, "General Solution of the Luneberg Lens Problem", *Journal of Applied Physics*, vol. 29, No. 9, Sep. 1958, pp. 1358–1368.

Snyder, James J., Patrick Reichert, and Thomas M. Baer, "Fast diffraction–limited cylindrical microlenses", in Applied Optics, vol. 30., No. 19, 1 Jul. 1991, pp. 2743–2747.

Cunningham, E.A., "Collimated light source with laser diode and microcylindrical lens", in IBM Technical Disclosure Bulletin, vol. 19, No. 2, Jul. 1976, pp. 625–626.

*Primary Examiner*—Leon Scott, Jr.
*Attorney, Agent, or Firm*—Merchant, Gould, Smith, Edell, Welter & Schmidt, P.A.

[57] ABSTRACT

The multiple emitters laser diode assembly comprises a laser diode bar for emitting a laser beam. The laser diode bar comprises a plurality of emitters aligned with respect to each other in a same plane of emission. A graded-index elongated fiber microlens is transversely set at a given distance in front of the laser diode bar for controlling the divergence of the beam. The microlens has an axis of symmetry substantially intersecting the optical axis of each emitter. A mount is provided for positioning the microlens with respect to the laser diode bar. Alternatively, the assembly may comprise a laser diode array for emitting the beam. The laser diode array comprises a plurality of substantially parallel rows of emitters with a substantially regular period between them. An array of graded-index elongated fiber microlenses is positioned substantially parallel to the rows. Each microlens corresponds to one of the rows for collimating the beam generated thereby. The GRIN fiber microlens shows less alignment sensitivity than ordinary fiber lens or aspherical fiber lens when used in a multiple emitters laser diode assembly. The GRIN lens further has the advantage of collimating a laser diode bar or array with a high degree of quality while minimizing phase aberration and distortion in the collimated transmitted beam.

10 Claims, 6 Drawing Sheets

U.S. PATENT DOCUMENTS

| | | | |
|---|---|---|---|
| 4,277,271 | 7/1981 | Krohn | 65/3 |
| 4,372,767 | 2/1983 | Maklad | 65/3.12 |
| 4,422,733 | 12/1983 | Kikuchi et al. | 350/413 |
| 4,557,566 | 12/1985 | Kikuchi et al. | 350/413 |
| 4,731,787 | 3/1988 | Fan et al. | 372/66 |
| 4,785,459 | 11/1988 | Baer | 372/75 |
| 4,837,771 | 6/1989 | Baer | 372/75 |
| 4,851,024 | 7/1989 | Sakai et al. | 65/3.14 |
| 4,857,091 | 8/1989 | Geittner et al. | 65/3.12 |
| 4,867,544 | 9/1989 | Bornstein et al. | 350/413 |
| 4,902,330 | 2/1990 | Sakai et al. | 65/30.13 |
| 4,908,832 | 3/1990 | Baer | 372/101 |
| 5,027,359 | 6/1991 | Leger et al. | 372/101 |
| 5,040,187 | 8/1991 | Karpinski | 372/50 |
| 5,080,706 | 1/1992 | Snyder et al. | 6/102 |
| 5,081,639 | 1/1992 | Snyder et al. | 372/101 |
| 5,127,068 | 6/1992 | Baer et al. | 372/108 |
| 5,128,951 | 7/1992 | Karpinski | 372/50 |
| 5,155,631 | 10/1992 | Snyder et al. | 359/708 |
| 5,181,224 | 1/1993 | Snyder | 372/101 |
| 5,284,790 | 2/1994 | Karpinski | 437/129 |
| 5,293,269 | 3/1994 | Burkhart et al. | 359/719 |
| 5,311,535 | 5/1994 | Karpinski | 372/50 |
| 5,369,661 | 11/1994 | Yamaguchi et al. | 372/75 |
| 5,417,733 | 5/1995 | Wesson | 65/378 |
| 5,421,848 | 6/1995 | Maier et al. | 65/102 |
| 5,426,533 | 6/1995 | Wallace | 359/710 |
| 5,436,990 | 7/1995 | Head et al. | 385/34 |
| 5,450,244 | 9/1995 | Fantone | 359/710 |
| 5,526,373 | 6/1996 | Karpinski | 372/101 |

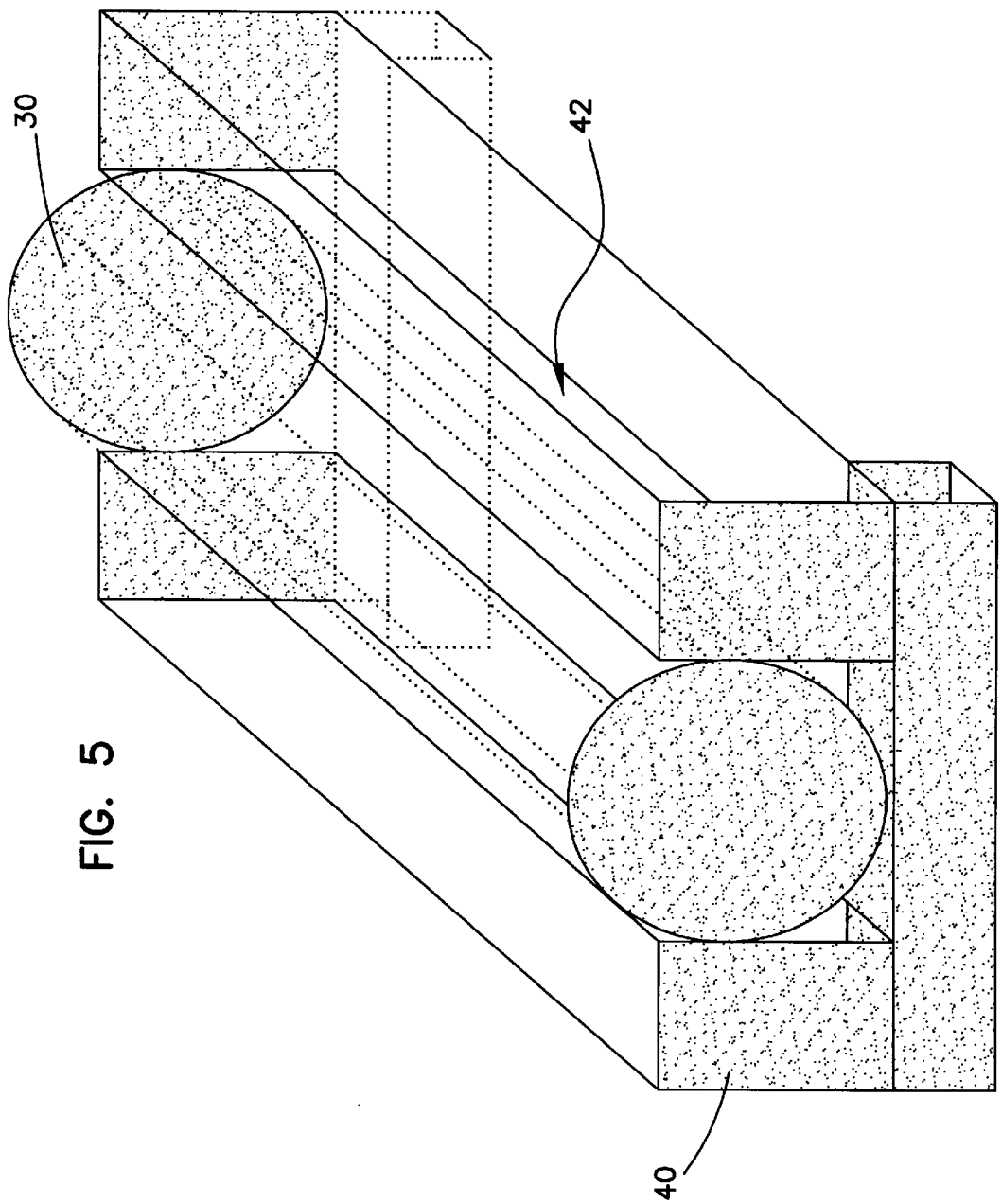

MULTIPLE EMITTER LASER DIODE ASSEMBLY WITH GRADED-INDEX FIBER MICROLENS

BACKGROUND

Laser diodes alone produce a beam that is divergent and astigmatic. In case of a laser diode assembly using multiple emitters, such a laser diode bar or a laser diode array, the small dimension of the emitters causes a very large divergence of the beam emitted therefrom. Typically, the divergence angle is about 10° in the plane parallel to the diode junction (slow axis) and about 40° in the plane perpendicular to the diode junction (fast axis). Hence, a laser diode bar or array may be considered as a high numerical aperture source. The numerical aperture (NA) is defined as the sine of the half angle of emission. A typical NA is between 0.4 and 0.6.

In order to collimate efficiently one of the axes of the laser diode bar or array, the collimating optic has a NA greater than the divergence of the laser diode bar or array and should not introduce optical aberrations or distortions in the wavefront of the collimated beam.

There exist different kinds of optics for collimating a laser diode bar or array. Examples of such optics are ordinary cylindrical fiber lenses, ball lenses, aspherical fiber lenses, photothermally generated lens arrays and holographic or binary diffractive optics.

Cylindrical fiber and ball lenses are inexpensive but they generally introduce severe spherical aberrations when they are used at high NA. This limits the quality of the collimation. The aspherical fiber lenses result in a high quality collimation at high NA but since they have a non-circular shape and very accentuated angles, their application is difficult due to the alignment difficulties they may generate. For instance, a torsion in an aspherical fiber lens will cause major alignment problems for many applications. Moreover, the aspherical fiber lenses are drawn from a fiber preform having three square faces and one convex face, which causes additional difficulties in the production of the preform and in the drawing of the fiber. As for photothermally generated lens arrays, they suffer from low efficiency when used at high NA and are more difficult to align since each emitter in a laser diode bar has to be aligned with each dot lens of a lens array for the two axes. Holographic and binary diffractive optics show a good potential but are presently limited to a low collimating efficiency at high NA.

The collimation of multiple emitters laser diode bars or arrays requires a different approach than the collimation of a single emitter laser diode because the methods of collimation that ensure a diffraction limited beam from a single emitter laser diode are difficult to realize in practice for multiple emitters laser diode assemblies. For example, the fast axis of a single emitter laser diode may be collimated to the diffraction limit by using an ordinary optical fiber microlens if the diameter of the optical fiber is smaller than about 100 times the emission wavelength of the laser beam. For instance, if a 800 nm wavelength is used, the diameter of the optical fiber would then be smaller than 80 $\mu$m. The back focal length d, defined as the distance from the vertex of the surface to the focus, is given by the following equation:

$$d = \frac{r(2-n)}{2(n-1)} = \frac{f(2-n)}{n}$$

wherein
n is the index of refraction of the fiber;
f is the focal length of the lens; and
r is the redius of the fiber.

Assuming the fiber has an index of refraction n at 800 nm that is around 1,78 for a 80 $\mu$m diameter fiber, the back focal length would be around 5,6 $\mu$m (the focal length f is equal to 45,6 $\mu$m). It means that in order to collimate a single emitter laser diode to the diffraction limit (negligible spherical aberration), the distance between the emitter and the optical fiber (nearest surface) should be around 5,6 $\mu$m for the entire width of the single emitter laser diode junction. This junction is typically in the order of a hundred micron.

In order to evaluate the tolerance of the distance between the fiber lens and the laser diode, we first evaluate the depth of the field of the lens. The depth field $\delta$ is given by the following equation:

$$\delta = \frac{f^2 \beta}{A}$$

where
$\beta$ is the angular blur; and
A is the lens aperture diameter.

In the present example, A has a value of 80 $\mu$m. Since the single emitter laser diode junction has a thickness of around 1 $\mu$m, the lens has an angular blur $\beta$ of around 22 mrad (=1 $\mu$m/f). In such a case, the depth field $\delta$ would be around 0,6 $\mu$m. This means that the variation of the distance between the fiber lens and the single emitter laser diode junction must be roughly smaller than 1 $\mu$m in order to keep the emitter surface at focus with the lens. In the case of a single emitter with a typical width of 100 $\mu$m, this variation represents an error of 1%. Although it requires a great precision, it is possible to obtain such a result.

In the case of a multiple emitters laser diode assembly, where the width may be typically 10000 $\mu$m (10 mm), the 1 $\mu$m tolerance represents an error of 0,01% which is, in practice, very difficult, if not impossible to achieve. For this reason, collimating a laser diode bar or array is very difficult compared to the collimation of a single emitter laser diode.

Additionally, mechanical distortions in the laser diode bar may occur during its mounting. One particular deformation is sometimes referred to as the "smile" due to the usual resulting curvature in the material. Some irregular deformations may also occur. The lens, in either case, is then slightly shifted off-axis, thereby reducing the efficiency of the collimation. In macro-optics, this effect is partially controlled by using bigger lenses. However, in micro-optics, it is desired to have small diameter lenses for reasons of compactness. The use of lenses with a greater diameter is therefore not a suitable solution.

Although collimation is the most common application for microlenses, the microlenses may be used for controlling the divergence in different ways.

SUMMARY

The present invention is directed to the combination of a graded-index fiber lens (GRIN) with a multiple emitters laser diode assembly, such as a laser diode bar or a laser diode array. A GRIN lens is a lens where the index of refraction varies with the radius. This has been found as a very suitable solution to the problems caused when controlling the divergence of a multiple emitters laser diode assembly. The GRIN fiber lens shows less alignment sensitivity than an ordinary fiber lens or an aspherical fiber lens. The GRIN lens further has the advantage of controlling the divergence of a laser diode bar or array with a high degree of quality while minimizing phase aberration and distortion in the transmitted beam.

More particularly, the object of the present invention is to provide a multiple emitters laser diode assembly for producing a laser beam. The assembly comprises a laser diode bar for emitting the beam. The laser diode bar comprises a plurality of emitters aligned with respect to each other in a same plane of emission and each emitter has an optical axis. A graded-index elongated fiber microlens is transversely set at a given distance in front of the laser diode bar for controlling the divergence of the beam. The microlens has an axis of symmetry substantially intersecting the optical axis of each emitter. A mounting means is provided for positioning the microlens with respect to the laser diode bar.

It is also another object of the present invention to provide a multiple emitters laser diode assembly comprising a laser diode array. The laser diode array comprises a plurality of substantially parallel rows of emitters with a substantially regular period. Each row comprises a plurality of emitters aligned with respect to each other in a same plane of emission and each emitter has an optical axis. All rows are substantially in the same plane of emission. The assembly also comprises an array of graded-index elongated fiber microlenses substantially parallel to each other. Each microlens corresponds to one of the rows for controlling the divergence of the beam generated thereby. The microlenses have a period with adjacent microlenses that is substantially corresponding to the period of the rows. Each microlens is transversely set at a given distance in front of the corresponding row and has an axis of symmetry substantially intersecting the optical axis of each emitter thereof. Mounting means are also provided for positioning each microlens with respect to the corresponding row.

A non restrictive description of preferred embodiments of the present invention will now be given with reference to the appended drawings.

BRIEF DESCRIPTION OF THE DRAWINGS

FIG. 5 is a perspective view of a mount in which a microlens is set.

IDENTIFICATION OF THE COMPONENTS

Figure 1:
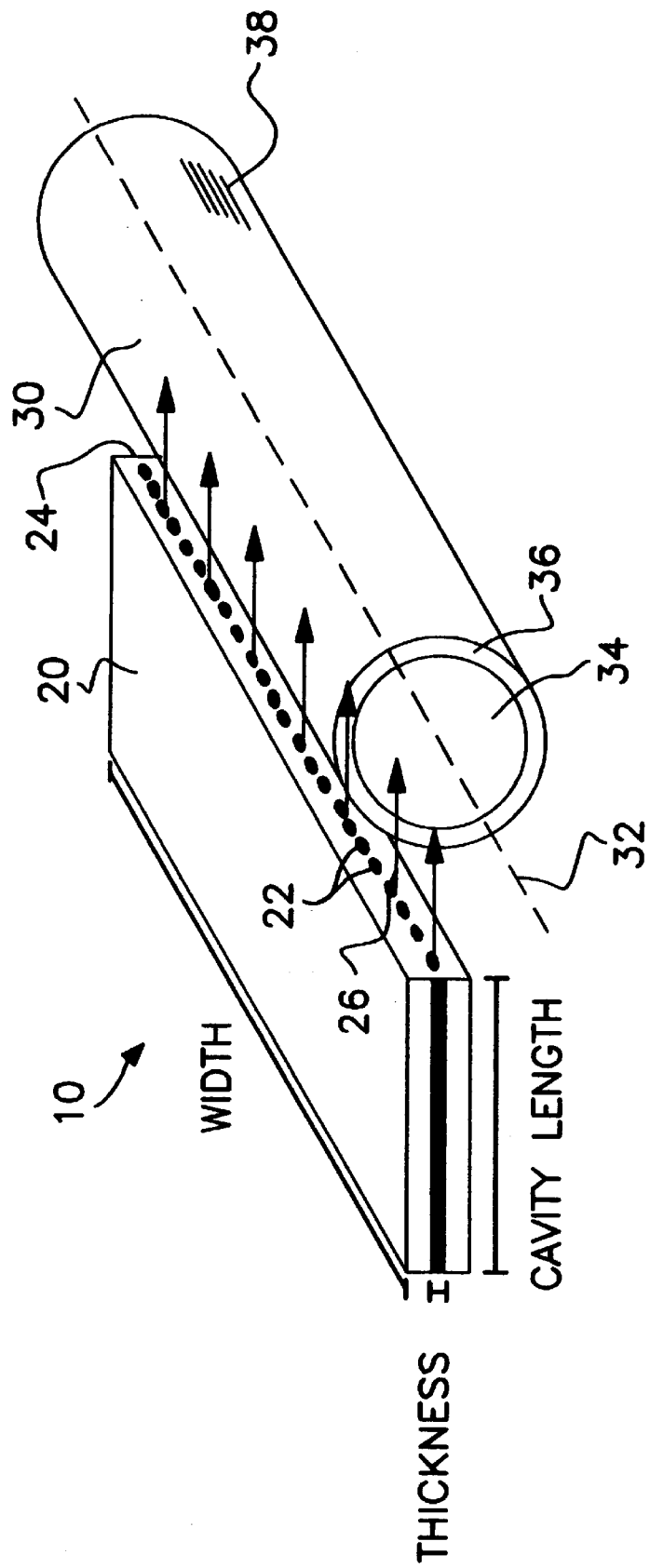
FIG. 1 is a perspective view of a laser diode bar with a GRIN fiber microlens according to an embodiment of the present invention.
Figure 2:
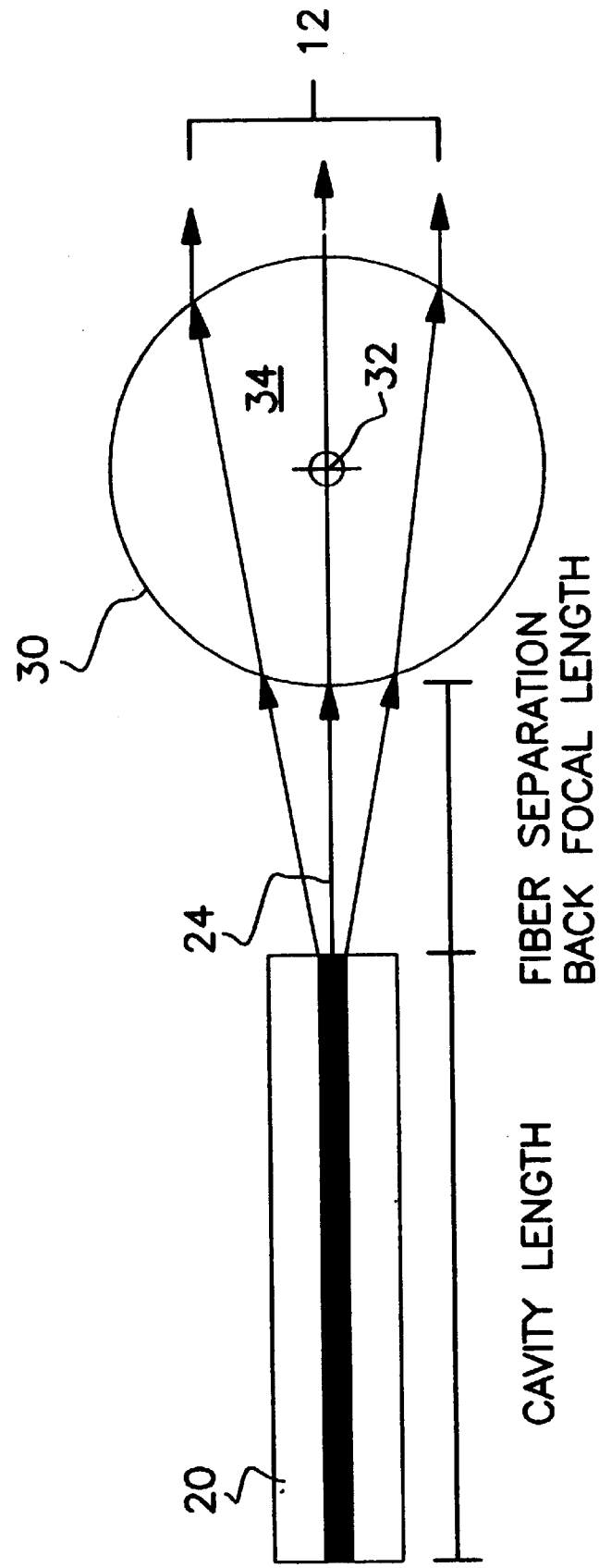
FIG. 2 is a side view of a laser diode bar with a GRIN fiber microlens according to an embodiment of the present invention.
Figure 3A:
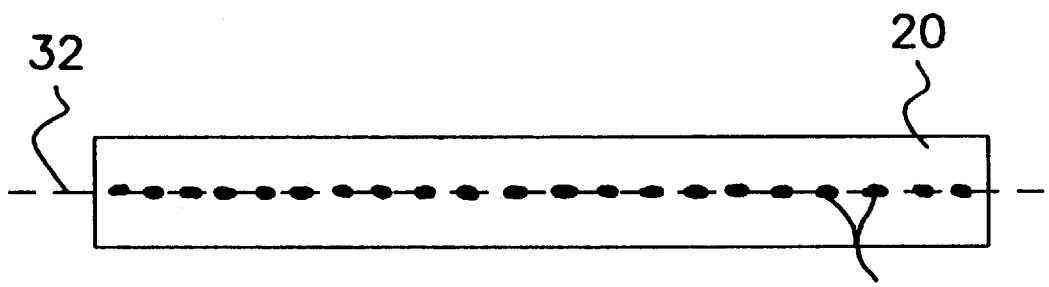
FIG. 3A is a front view of a laser diode bar with all emitters in the same plane.
Figure 3B:
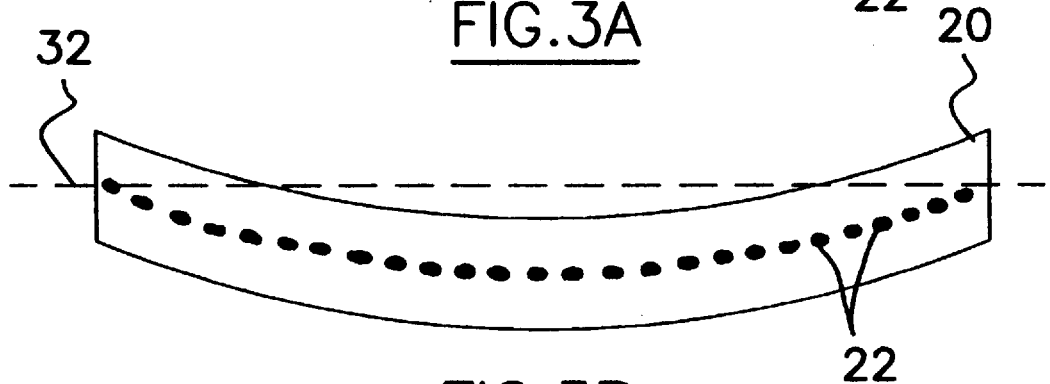
FIG. 3B is a front view of a laser diode bar with a "smile".
Figure 3C:
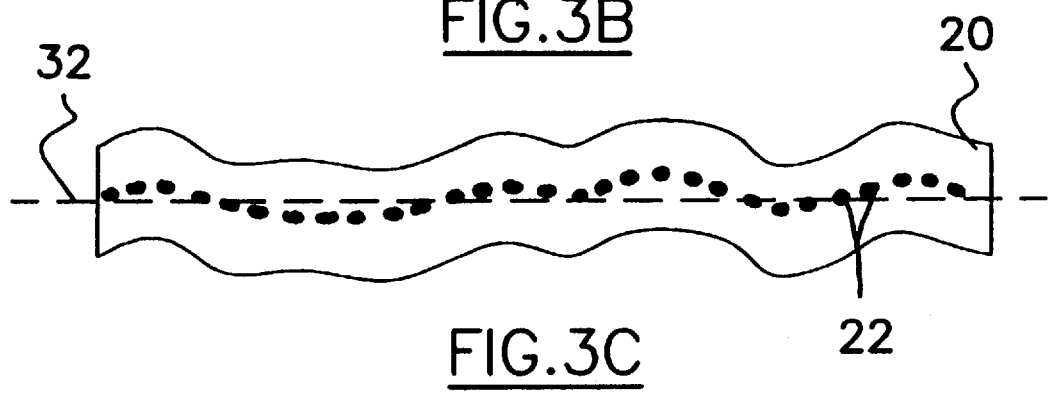
FIG. 3C is a front view of a laser diode bar with irregular deformations.

The following is a list of the reference numerals, along with the names of the corresponding components, that are used in the appended drawings and in the description. This list is only given for the convenience of the readers and should not be interpreted as restricting the scope or spirit of the present invention.

10 assembly
12 laser beam
20 laser diode bar
22 emitters
24 plane of emission (of each laser diode bar)
26 optical axis (of each emitter)
30 graded-index fiber microlens (or microlenses)
32 axis of symmetry (of each microlens)
34 graded-index core
36 cladding
38 antireflexion coating
40 mount
42 groove
50 laser diode array
52 array of microlenses

DESCRIPTION

FIG. 1 shows a multiple emitters laser diode assembly (10) used for producing a laser beam (12) according to a possible embodiment of the present invention. The assembly (10) comprises a single laser diode bar (20) provided with a plurality of emitters (22) aligned with respect to each other in a same plane of emission (24). The laser diode bar (20) is preferably made of GaAlAs but any other suitable semiconductor material may be used, most likely the materials allowing operation from the upper end of the visible spectrum (about 400 nm) to the mid infrared (about 5000 nm). A typical wavelength is about 810 nm.

As aforesaid, in a laser diode assembly using multiple emitters (22), the small dimension of the emitters (22) causes a very large divergence of the beam emitted therefrom. Typically, the divergence angle is about 10° in the plane parallel to the diode junction (slow axis) and about 40° in the plane perpendicular to the diode junction (fast axis). The fast axis is thus generally collimated in priority in order to obtain an optimum optical transmission of the beam emitted by all the emitters (22). In order to collimate all the emitters (22) at the same time, the microlens (30) is positioned with great precision in front of the laser diode bar (20) with its axis of symmetry (32) (longitudinal axis) substantially intersecting the optical axis (26) of each emitter.

The present invention may also be used for collimating the slow axis by using a microlens perpendicular to the plane of emission. It may further be used to modify or control the divergence, other than collimation, of a laser diode bar or array.

As an example, a typical laser diode bar has around 16 emitters with an even spacing between adjacent emitters of about 550 μm. The emitters have a width of about 100 μm, a thickness of about 1 μm and a cavity length (depth) of about 500 μm. Of course, other dimensions are suitable and depend on the specific needs, like the mode of operation (pulse or continuous), the peak power, the duty factor, etc. Some specifications may be required to obtain an optimum performance, such as the tolerance of the cavity length of the laser diode bar (20) which has to be typically ±5 μm. It is important to select a suitable mechanical tolerance in the design of a laser diode bar or array, otherwise a severe degradation of the performance may be encountered in some situations.

According to the present invention, it has been found that the use of a fiber microlens (30) with a graded-index core (34) (GRIN) transversely set in front of a laser diode bar (20) allows a high collimation efficiency of the fast axis at high NA with a low spherical aberration on the transmitted beam (12). A mounting means is used for positioning the microlens (30) with respect to the laser diode bar (20).

The microlens (30) is defined as an elongated fiber since its length is more important than its diameter. The GRIN microlens (30) is preferably a nonfull aperture Luneberg-type lens with a homogenous cladding (36) obtained by a suitable process. However, the present invention is not limited to nonfull aperture Luneberg-type lenses and could be, for instance, a full aperture Luneberg-type lens with or without the homogenous cladding or a nonfull aperture GRIN with a profile different from the Luneberg-type and with or without homogenous cladding. The GRIN microlens (30) may also have non-circular cross section.

The GRIN microlens (30) with a nonfull aperture Luneberg-type profile shows high collimation efficiency at high numerical aperture (NA) with low spherical aberration on the transmitted beam. Also, since the cross section of this microlens is circular, the performance of the microlens is invariant over rotation, thus allowing an easier alignment.

Figure 6:
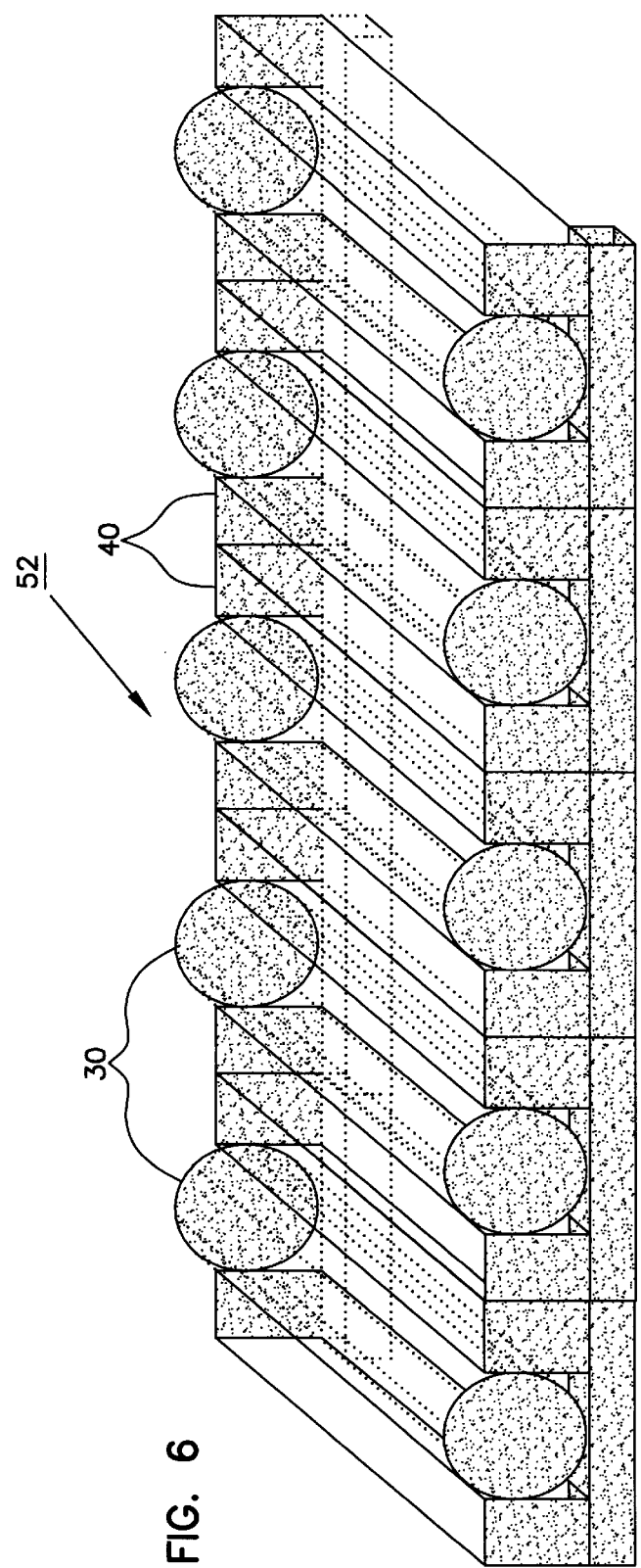
FIG. 6 is a perspective view of a plurality of mounts, with corresponding microlenses set therein, positioned side by side for creating an array of microlenses.

In order to obtain the best performance, the mechanical deformations of the laser diode bar (20) must be minimized. According to a preferred embodiment of the present invention, this is achieved by using a mount (40) issued from a "bars in grooves" packaging technique as shown in FIGS. 5 and 6. The advantage of the mount (40) is that it is possible to precisely align the emitters of a laser diode bar or bars (20) with respect to their plane of emission (24) (parallelism and period) and, in the case of a laser diode array, align the bar facets in the same plane within the depth field of the array of microlenses. The mechanical precision of the alignment is preferably between 1 μm and 10 μm. Of course, any other suitable mount which gives an equivalent precision may be used.

The mount (40) acts as a spacer/holder and is preferably made of ceramic, like BeO, but other materials are suitable. It may be machined with a groove (42) equal to the diameter of the microlens (30). It is further slightly longer than the corresponding laser diode bar (20) and the groove (42) is cut entirely through the ceramic material. This may be machined by conventional means, such as a diamond saw or a laser machining. In such mount (40), the microlens (30) is set in the groove (42) and is fixed, for instance, by means of an adhesive at its ends or by a mechanical pressure therein. The mount (40) will allow a greater precision in alignment.

It has been said that all emitters (22) of a laser diode bar (20) are on the same plane of emission (24). This plane of emission (24) is defined by the facet thickness and the width of the laser diode bar (20). All the emitters (22) are on the same axis which is perpendicular to the cavity length. Also the position of the microlens (30) with respect to the laser diode bar (20) should be controlled with great accuracy. The optical axis of all the emitters (22) should pass through the axis of symmetry of the GRIN microlens (30). The separation between the GRIN microlens (30) and the laser diode bar (20), more particularly the distance between the emitting surface of the laser diode bar (20) and the outside diameter of the GRIN microlens (30) closest to the laser diode bar (20), has to be kept constant and equal to the back focal length of the GRIN microlens (30) in order to collimate it.

Preferably, the microlens (30) may further comprise an antireflexion coating (38) in order to optimize its transmission.

As aforesaid, the present invention may be used with a laser diode array (50). The laser diode array (50) comprises a plurality of substantially parallel rows of emitters with a substantially regular period (spacing) between them. Each row comprises multiple emitters (22) aligned with respect to each other in a same plane of emission (24). It should be noted at this point that the rows of emitters may be laser diode bars (20), as shown in the drawings, or rows of a matrix of emitters. The rows may be vertical, horizontal, or in any other specified direction.

An array (52) of graded-index elongated fiber microlenses (30), substantially parallel to each other, is facing the rows of emitters. Each microlens (30) corresponds to one of the laser diode bar (20) for collimating the corresponding beam generated thereby. The period between adjacent microlenses (30) is substantially corresponding to the one of the rows.

Each microlens (30) is transversely set in front of the corresponding row and has an axis of symmetry (32) substantially intersecting the optical axis of each emitter thereof. Mounting means are provided for positioning each microlens with respect to the corresponding row.

Figure 4A:
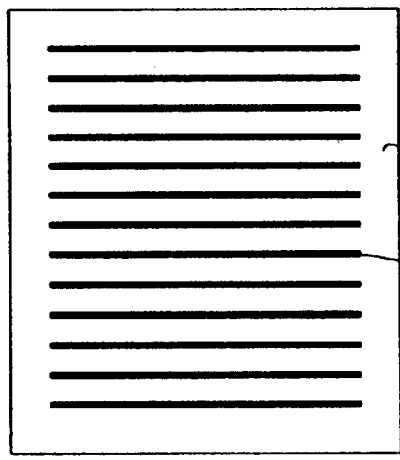
FIG. 4A is a front schematic view of a laser diode array with no error in the alignment of the laser diode bars.
Figure 4C:
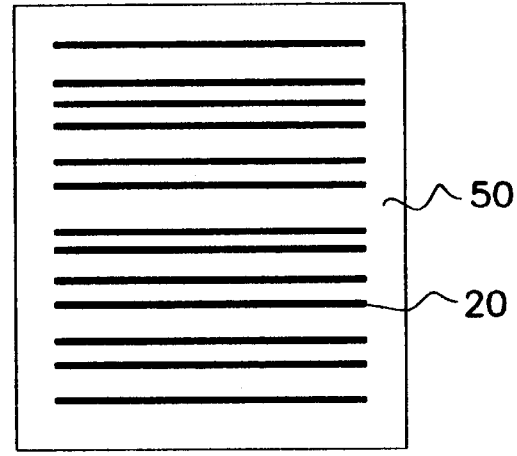
FIG. 4C is a front schematic view of a laser diode array with errors in the spacing of the laser diode bars.
Figure 4B:
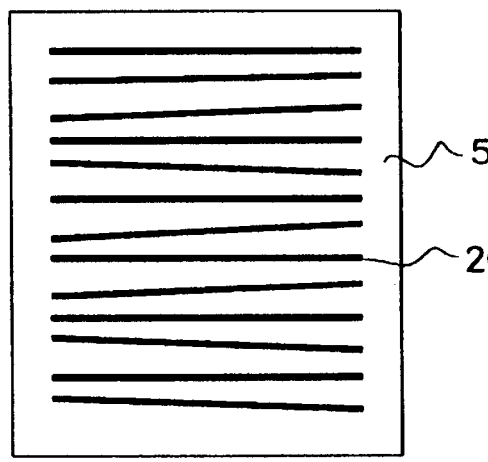
FIG. 4B is a front schematic view of a laser diode array with errors in the parallelism of the laser diode bars.
Figure 4D:
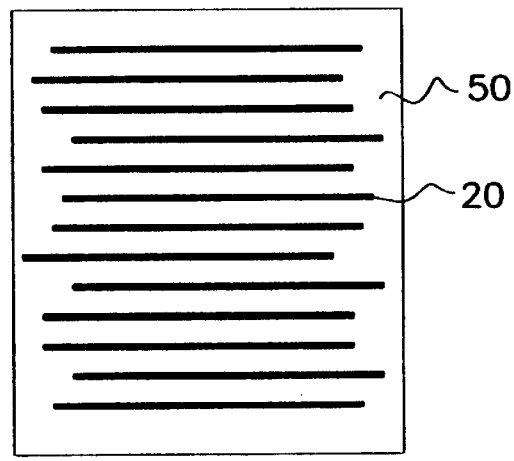
FIG. 4D is a front schematic view of a laser diode array with errors in the vertical alignment of the laser diode bars.

The emitters (22) of a row should be in the same plane of emission (24). All rows should also be aligned with respect to each other in order that the corresponding emitters (22) from adjacent rows be aligned with each other. All those mechanical alignments should be realized with the highest possible precision, preferably in the order of a few microns. FIG. 4A schematically shows a laser diode array (50) with no error in the alignment of laser diode bars (20). FIGS. 4B to 4D show different typical errors in a laser diode array (50) that may affect the performances of the collimation. In particular, FIG. 4B shows a laser diode array (50) with errors in the parallelism of the laser diode bars (20). FIG. 4C shows a laser 5 diode array (50) with errors in the spacing of the laser diode bars (20). FIG. 4D shows a laser diode array (50) with errors in the vertical alignment of the laser diode bars (20).

EXAMPLE

An experimental comparison of the collimating performances of different microlens has been realized in order to evaluate the GRIN fiber microlenses with a multiple emitters laser diode assembly. The GRIN microlens was a nonfull aperture Luneberg-type lens of 400 μm with a back focal length of 70 μm and a NA of 0,50. It was compared to an ordinary fiber lens (fused silica cylindrical fiber) with a diameter of 400 μm, 100 μm of back focal length and a NA of 0,50. The third lens used was an aspherical fiber lens with AR (BLUE SKYE™ Hyperbolic fiber microlens) of 250 μm×300 μm, a back focal length of 110 μm and a NA of 0,56. No antireflexion coating was present on the two other fiber microlenses and all of them were compared using the same laser diode bar. The results were as follows:

| Microlens | Divergence (deg) | Optical Transmission |
| --- | --- | --- |
| aspherical | 1,44 | 0,745 |
| ordinary | 1,08 | 0,773 |
| GRIN | 0,90 | 0,837 |

The best transmission and collimation were thus obtained with the GRIN fiber microlens.

In another experiment, the fast axis of a laser diode array of 64 laser diode bars was collimated with an array of GRIN fiber microlenses as described hereinabove. The results is an overall divergence beam in the fast axis of 2 degrees with a high efficiency.

Although preferred embodiments of the invention have been described in detail herein and illustrated in the accompanying drawings, it is to be understood that the invention is not limited to these precise embodiments and that various changes and modifications may be effected therein without departing from the scope or spirit of the invention.

What is claimed is:

1. A multiple emitter laser diode assembly for producing a laser beam, the assembly comprising
   a laser diode bar for emitting the beam, the laser diode bar comprising a plurality of emitters aligned with respect to each other in a same plane of emission, each emitter having an optical axis;
   a diffraction-limited, aberration-free, graded-index elongated fiber microlens transversely set at a given distance in front of the laser diode bar for controlling the divergence of the beam, the microlens having a circular cross-section with an axis of symmetry substantially intersecting the optical axis of each emitter; and
   a mounting means for positioning the microlens with respect to the laser diode bar.

2. An assembly according to claim 1, wherein the positioning means comprises a ceramic mount.

3. An assembly according to claim 2, wherein the microlens is fixed in the mount by means of an adhesive.

4. An assembly according to claim 1, wherein the microlens is a nonfull aperture Luneberg lens.

5. An assembly according to claim 1, wherein the microlens further comprises an antireflexion coating.

6. A multiple emitter laser diode assembly for producing a laser beam, the assembly comprising:
   a laser diode array for emitting the beam, the laser diode array comprising a plurality of substantially parallel rows of emitters with a substantially regular period, each row comprising a plurality of emitters aligned with respect to each other in a same plane of emission, all rows being substantially in the same plane of emission, each emitter having an optical axis;
   an array of graded-index elongated fiber microlenses substantially parallel to each other, at least one of the fiber microlens being diffraction-limited and abberation-free, each microlens corresponding to one of the rows for controlling the divergence of the beam generated thereby, the microlenses having a period with adjacent microlenses that is substantially corresponding to the period of the rows, each microlens being transversely set at a given distance in front of the corresponding row and having a circular cross-section with an axis of symmetry substantially intersecting the optical axis of each emitter thereof; and
   mounting means for positioning each microlens with respect to the corresponding row.

7. An assembly according to claim 6, wherein the positioning means comprise an integral ceramic mount.

8. An assembly according to claim 7, wherein each microlens is fixed in the corresponding mount by means of an adhesive.

9. An assembly according to claim 6, wherein each microlens is a nonfull aperture Luneberg lens.

10. An assembly according to claim 6, wherein each microlens further comprises an antireflexion coating.

* * * * *